United States Patent
Tan et al.

(10) Patent No.: US 9,996,986 B2
(45) Date of Patent: Jun. 12, 2018

(54) SENSOR OFFSET CALIBRATION USING MAP INFORMATION

(71) Applicant: GM GLOBAL TECHNOLOGY OPERATIONS LLC, Detroit, MI (US)

(72) Inventors: Hualin Tan, Novi, MI (US); Kevin A. O'Dea, Ann Arbor, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 756 days.

(21) Appl. No.: 14/471,222

(22) Filed: Aug. 28, 2014

(65) Prior Publication Data

US 2016/0061627 A1    Mar. 3, 2016

(51) Int. Cl.
| | |
|---|---|
| *G01C 25/00* | (2006.01) |
| *G07C 5/00* | (2006.01) |
| *G01C 21/26* | (2006.01) |
| *G01R 31/00* | (2006.01) |
| *G01R 35/00* | (2006.01) |

(52) U.S. Cl.
CPC .............. *G07C 5/00* (2013.01); *G01C 25/00* (2013.01); *G01R 31/006* (2013.01); *G01R 35/005* (2013.01)

(58) Field of Classification Search
CPC ........ G07C 5/00; G01C 25/00; G01R 35/005; G01R 31/006
See application file for complete search history.

(56) References Cited

U.S. PATENT DOCUMENTS

| | | | |
|---|---|---|---|
| 5,828,585 A | 10/1998 | Welk et al. | |
| 7,096,116 B2 | 8/2006 | Tanaka et al. | |
| 2004/0148093 A1* | 7/2004 | Tanaka | G01C 21/00 701/400 |
| 2009/0005985 A1* | 1/2009 | Basnayake | G01C 25/00 701/501 |
| 2012/0173185 A1* | 7/2012 | Taylor | G01B 11/026 702/104 |

FOREIGN PATENT DOCUMENTS

| | | |
|---|---|---|
| CN | 102023008 A | 4/2011 |
| KR | 20110085495 A | 7/2011 |

OTHER PUBLICATIONS

State Intellectual Property Office of the People's Republic of China, Office Action in Chinese Patent Application No. 201510537799.2 dated Aug. 31, 2017.

* cited by examiner

*Primary Examiner* — Mohamed Charioui
*Assistant Examiner* — Jeremy Delozier
(74) *Attorney, Agent, or Firm* — Lorenz & Kopf, LLP (57) ABSTRACT

Systems, processes, and techniques for calibrating an onboard sensor of a vehicle are presented here. The vehicle has a control system that is capable of performing at least some of the tasks related to the calibration procedure. An exemplary methodology collects vehicle status data and obtains navigation map data during operation of the vehicle. A current calibration factor is calculated for the onboard sensor, based on the collected vehicle status data and the obtained navigation map data. More specifically, the vehicle status and navigation map data can be used to determine when the current conditions are suitable for performing calibration. When the current conditions are satisfactory, the calibration factor is calculated. Thereafter, the onboard sensor can be calibrated in response to the current calibration factor.

19 Claims, 2 Drawing Sheets

SENSOR OFFSET CALIBRATION USING MAP INFORMATION

TECHNICAL FIELD

Embodiments of the subject matter described herein relate generally to onboard sensors and related sensor systems of the type used onboard a vehicle. More particularly, embodiments of the subject matter relate to calibration techniques for calculating offset values for onboard vehicle sensors.

BACKGROUND

Modern vehicles such as automobiles, aircraft, and watercraft utilize onboard sensors to support various functions, features, and subsystems. An automobile, for example, may include any or all of the following onboard sensors: wheel speed sensors; accelerometers; steering wheel angle sensors; temperature sensors; and the like. Frequent or real-time calibration of certain types of onboard sensors may be implemented to ensure that the raw sensor data can be adjusted or offset to provide accurate information to the subsystems or functions that rely on the sensor data.

Calibration of an onboard sensor can be performed while the vehicle is operating to minimize error associated with "zero" readings of the sensor. For example, if the vehicle is motionless, then a longitudinal acceleration sensor should generate a sensor value that is indicative of zero acceleration. In practice, however, the longitudinal acceleration sensor may produce a slight nonzero offset value under certain conditions, especially when the vehicle is in operation. This offset value can be used to calibrate actual measured sensor values obtained when the vehicle is in motion, resulting in more accurate longitudinal acceleration data.

Accordingly, it is desirable to have improved techniques for calibrating onboard vehicle sensors. In addition, it is desirable to have an improved calibration technique that leverages information and data that is readily available onboard the host vehicle such that onboard sensors can be calibrated in real-time while the vehicle is operational. Furthermore, other desirable features and characteristics will become apparent from the subsequent detailed description and the appended claims, taken in conjunction with the accompanying drawings and the foregoing technical field and background.

BRIEF SUMMARY

A method of calibrating an onboard sensor of a vehicle is presented here. The vehicle has a control system that is capable of carrying out the method. An exemplary embodiment of the method collects vehicle status data during operation of the vehicle, and obtains navigation map data during operation of the vehicle. The method continues by calculating a current calibration factor for the onboard sensor based on the collected vehicle status data and the obtained navigation map data. The current calibration factor can be used to calibrate the onboard sensor.

A computer readable storage media includes executable instructions capable of performing a method of calibrating on onboard sensor of a vehicle. An exemplary embodiment of the method collects vehicle status data and obtains navigation map data during operation of the vehicle. The method continues by analyzing the collected vehicle status data and the obtained navigation map data to determine whether calibration initiation conditions are satisfied. A current calibration factor is calculated for the onboard sensor based on the collected vehicle status data and the obtained navigation map data. The calculating is performed when the calibration initiation conditions are satisfied.

Also presented here is a vehicle having: an onboard sensor configured to generate raw sensor values; and a control system having at least one processor device to collect vehicle status data during operation of the vehicle, obtain navigation map data during operation of the vehicle, determine that calibration initiation conditions are satisfied based on current vehicle status data and current navigation map data, and calculate a current sensor offset factor for the onboard sensor in response to determining that the calibration initiation conditions are satisfied.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. Moreover, it should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in any processor-readable medium, which may be realized in a tangible form. The "processor-readable medium" or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, or the like.

The subject matter presented here relates to improved techniques for obtaining accurate vehicle sensor data. An onboard vehicle sensor is calibrated during operation of the vehicle to generate a zero offset value, which is thereafter applied to the raw sensor data to generate calibrated sensor data. Data collected or accessed during operation of the vehicle is used as a trigger mechanism to initiate the sensor calibration routine at appropriate times, e.g., when conditions are satisfactory for performing accurate calibrations. As described in more detail below, the onboard sensor calibration system leverages navigation map data to improve the results of the sensor calibration procedure. More specifically, real-time navigation map data (along with other information such as geographic position data and/or vehicle status data) is analyzed to determine whether or not the current operating conditions are suitable for purposes of initiating a sensor calibration procedure.

Figure 1:
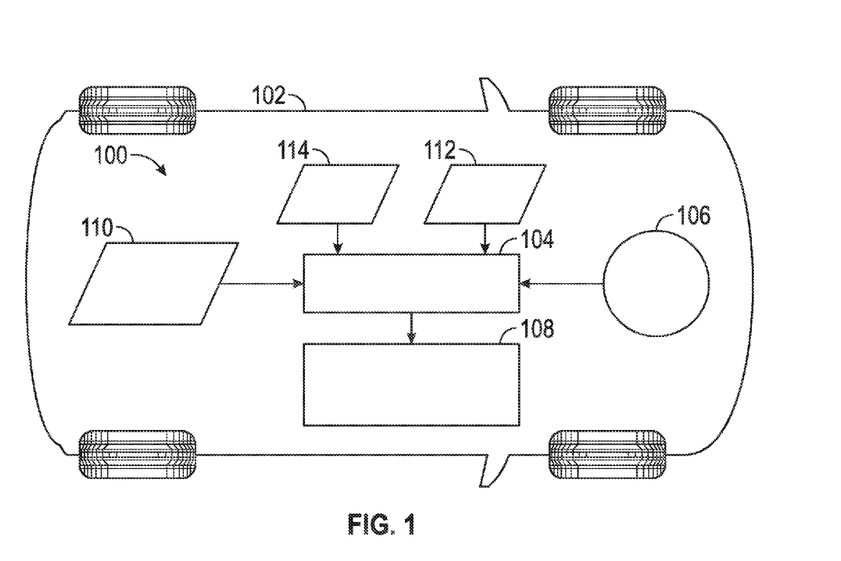
FIG. 1 is a block diagram of an exemplary embodiment of a sensor calibration system onboard a vehicle.

Turning now to the drawings, FIG. 1 is a block diagram of an exemplary embodiment of a sensor calibration system 100 onboard a vehicle 102. Although FIG. 1 depicts the vehicle 102 as an automobile, the concepts presented here can be deployed in other vehicle types, such as aircraft, spacecraft, watercraft, motorcycles, and the like. Moreover, the concepts presented here may also be deployed in non-vehicular applications if so desired. The sensor calibration system 100 generally includes, without limitation: a control system 104; an onboard sensor 106; and a destination subsystem, function, process, or feature (hereinafter referred to as the destination subsystem 108). It should be appreciated that the illustrated embodiment has been simplified for ease of understanding, and that the sensor calibration system 100 may include additional devices, processing modules, and elements that support additional features and functions that need not be described in detail here. Likewise, those skilled in the art will recognize that an embodiment of the vehicle 102 will include many conventional features, subsystems, and components that are commonly found in modern vehicles. Such conventional aspects of the vehicle 102 will not be described here.

Although FIG. 1 only depicts one onboard sensor 106, the vehicle 102 may utilize a plurality of different onboard sensors 106 as needed. Moreover, an onboard sensor 106 could be realized as an individual component or as an integrated element of a component having multiple onboard sensors 106. The onboard sensor 106 generates a measurable characteristic that is indicative of the phenomena being measured. In certain embodiments, the onboard sensor 106 produces a measurable electrical signal or quantity that may be considered to be the raw sensor data or the raw sensor value. For example, the measurable quantity (raw sensor value) could be a voltage, a current, an impedance, or the like. Raw sensor values may be generated as an analog quantity, or they could be generated in the digital domain, depending on the particular sensor type.

Different onboard sensor types can be utilized by the vehicle 102 to support various functions and operations. In certain embodiments, and without limitation, the onboard sensor 106 is realized as: a wheel speed sensor that generates raw sensor values indicative of the speed of a corresponding wheel; a longitudinal acceleration sensor that generates raw sensor values indicative of acceleration of the vehicle 102 along its longitudinal axis; a lateral acceleration sensor that generates raw sensor values indicative of acceleration of the vehicle 102 along its lateral axis; a yaw rate sensor that generates raw sensor values indicative of the yaw rate of the vehicle 102; or a steering angle sensor that generates raw sensor values indicative of the steering angle of the vehicle 102. Although not always required, the vehicle 102 may include an inertial measurement unit that includes a longitudinal acceleration sensor, a lateral acceleration sensor, and a yaw rate sensor (or that otherwise includes the functionality of the three sensors).

Ideally and theoretically, each onboard sensor 106 generates an output (e.g., zero volts) that indicates a corresponding baseline or zero condition. In some embodiments, for example, the longitudinal acceleration sensor should generate a raw sensor value of zero volts when the vehicle 102 is experiencing no longitudinal acceleration. Similarly, the steering angle sensor should generate a raw sensor value of zero volts when the steering wheel of the vehicle 102 is positioned such that it results in a steering angle of zero degrees. In reality, however, any given onboard sensor 106 might generate a nonzero raw sensor value under such zero conditions. The sensor calibration system 100 strives to compensate for nonzero raw sensor values by calculating zero offset values that can be applied to correct or otherwise adjust the raw sensor values.

Each sample of the raw output of the onboard sensor 106 is provided to the control system 104 for processing in accordance with the sensor calibration techniques presented herein. In certain embodiments, the control system 104 is implemented as at least one electronic control unit (ECU) of the vehicle 102, wherein each ECU includes at least one processor device that carries out the operations and functions described in more detail below. For simplicity, FIG. 1 depicts the control system 104 as a single block. It should be appreciated, however, that the control system 104 could be implemented using a plurality of physically distinct components that are designed to cooperate with one another in a distributed manner to execute the desired functionality.

The control system 104 is suitably configured to collect, receive, generate, access, or otherwise obtain vehicle status data 110 during operation of the vehicle 102. Some or all of the vehicle status data 110 is obtained in real-time or substantially real-time as needed, e.g., the vehicle status data 110 may be sampled frequently during operation of the vehicle. For example, the vehicle status data 110 can be checked and updated according to any desired rate, such as once every 100 milliseconds, once per second, or the like. In certain exemplary implementations, the vehicle status data 110 is checked once every 10 milliseconds. The vehicle status data 110 can be generated and provided by any number of onboard components, instruments, measurement devices, sensors, transducers, or the like. Indeed, the vehicle status data 110 can be produced by one or more of the onboard sensors 106 if so desired.

Generally, the vehicle status data 110 indicates the current operating status, condition, and/or state of the vehicle 102 at the given sampling time. As explained in more detail below, the vehicle status data 110 is used to determine whether or not the current operating conditions are satisfactory for purposes of calibrating the onboard sensor 106 of interest. Depending upon the type of onboard sensor 106 being calibrated, the specific configuration of the vehicle 102, and/or the particular embodiment of the sensor calibration system 100, the vehicle status data 110 may include any or all of the following data, without limitation: data that indicates whether the vehicle is driving straight (which may be based on the output of an inertial measurement unit, wheel speed sensors, and/or a steering wheel angle sensor); vehicle speed data (which may be based on the output of wheel speed sensors); data that indicates how long the vehicle 102 has been driven at a constant or near-constant speed; vehicle acceleration data (which may be based on the output of an inertial measurement unit); time/date data; calendar data; temperature data; weather data; etc.

The control system 104 is also suitably configured to collect, receive, generate, access, or otherwise acquire geographic position data of the vehicle 102. In certain embodiments, the geographic position data corresponds to global positioning system (GPS) data 112. Although not shown in FIG. 1, the vehicle 102 includes a GPS receiver or unit (which may be integrated with the vehicle 102 or realized as an portable or mobile device) that provides the GPS data 112 in accordance with conventional GPS techniques, protocols, and methodologies. The GPS data 112 is obtained in real-time or substantially real-time as needed, e.g., the GPS data 112 may be refreshed as frequently as needed during operation of the vehicle.

The control system 104 is also configured to collect, receive, generate, access, or otherwise obtain navigation map data 114 during operation of the vehicle 102. In some embodiments, the navigation map data 114 is obtained in real-time or substantially real-time from a content delivery service, e.g., a cellular provider, a satellite service, or any over-the-air service provider. In other embodiments, the navigation map data 114 is locally stored at the vehicle 102 for immediate access when needed, and the stored navigation map data 114 can be updated (via any conventional programming or downloading technique) as needed. The exemplary embodiment described here assumes that the navigation map data 114 is locally stored in association with the control system 104, and that the navigation map data 114 can be updated at any time to maintain accuracy. In other embodiments, the navigation map data 114 can be locally stored at another module or component of the vehicle 102 for retrieval or access by the control system 104 as needed.

The navigation map data 114 is linked to the GPS data 112 in that the current geographical position of the vehicle 102 influences the portion of the navigation map data 114 that is deemed relevant for purposes of sensor calibration. For example, the navigation map data 114 of interest can be geographically defined based on the current GPS data 112. Thus, the control system 104 need not devote any resources or processing power to navigation map data 114 that has little to no relevance to the current operating state of the vehicle 102.

In certain preferred embodiments, the navigation map data 114 is "full featured" in that it contains or defines mapping information that extends beyond that found in basic and conventional road maps. The navigation map data 114 includes standard map information that defines, describes, and/or otherwise characterizes roads, highways, freeways, geographic regions and boundaries, onramps and off-ramps, points of interest, bodies of water, and the like. In certain embodiments, the navigation map data 114 includes enhanced data that defines, describes, and/or otherwise characterizes some or all of the following, without limitation: amount of road curvature; the grade (upward or downward slope) of roads; the banking angle of roads; the surface quality, composition, smoothness, and/or roughness of roads; the presence of overhead obstructions or structures (which may be caused by bridges, tunnels, natural terrain and landscaping, buildings, signage, walkways, public transportation infrastructure, etc.); the contour of roads; and the like. The importance and relevance of the enhanced navigation map data 114 will become apparent from the description that follows.

Figure 2:
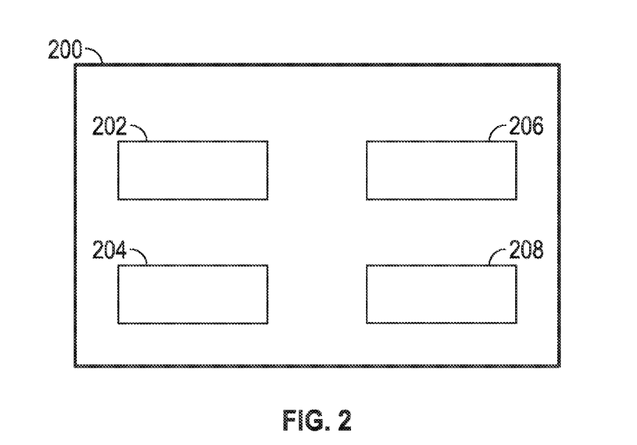
FIG. 2 is a block diagram of an exemplary embodiment of an electronic control unit (ECU) suitable for use in an onboard sensor calibration system.

FIG. 2 is a block diagram of an exemplary embodiment of an electronic control unit (ECU) 200 suitable for use in the onboard sensor calibration system 100. As mentioned above, the sensor calibration system 100 employs at least one ECU 200 to perform the various processes and techniques described here. Although one ECU 200 can manage the described functionality, various embodiments may employ a plurality of ECUs 200 to support the functionality in a cooperative and distributed manner. For simplicity, only one ECU 200 is shown and described here. The illustrated embodiment of the ECU 200 generally includes, without limitation: at least one processor device 202; general purpose memory 204; computer-readable storage media 206; and a communication module 208. In practice, the ECU 200 may include additional elements, devices, and functional modules that cooperate to achieve the desired functionality.

The processor device 202 is capable of executing the processor-executable instructions stored in the computer-readable storage media 206, wherein the instructions cause the ECU 200 to perform the various processes, operations, and functions described herein. In practice, the processor device 202 may be implemented as a microprocessor, a number of discrete processor devices, content addressable memory, an application specific integrated circuit, a field programmable gate array, any suitable programmable logic device, discrete gate or transistor logic, discrete hardware components, or any combination designed to perform the functions described here.

The memory 204 may be utilized to store program code that defines an operating system, a boot loader, or a BIOS for the ECU 200. Moreover, the memory 204 may include random access memory that serves as temporary data storage for the processor device 202. In this regard, the processor device 202 can write to and read from the memory 204 as needed to support the operation of the ECU 200.

The communication module 208 may be realized using software, firmware, hardware, processing logic, or any suitable combination thereof. In certain exemplary embodiments, the communication module 208 is suitably configured to support data communication between the ECU 200 and other modules, ECUs, sensors, or devices onboard the host vehicle 102. The communication module 208 may also be designed to support data communication with external devices or sources. For example, the communication module 208 may be used to receive downloaded navigation map data 114, GPS data 112, or the like. As another example, the communication module 208 can be used to receive output data from "external" sensors that are not otherwise coupled to the communication network onboard the vehicle 102.

Figure 3:
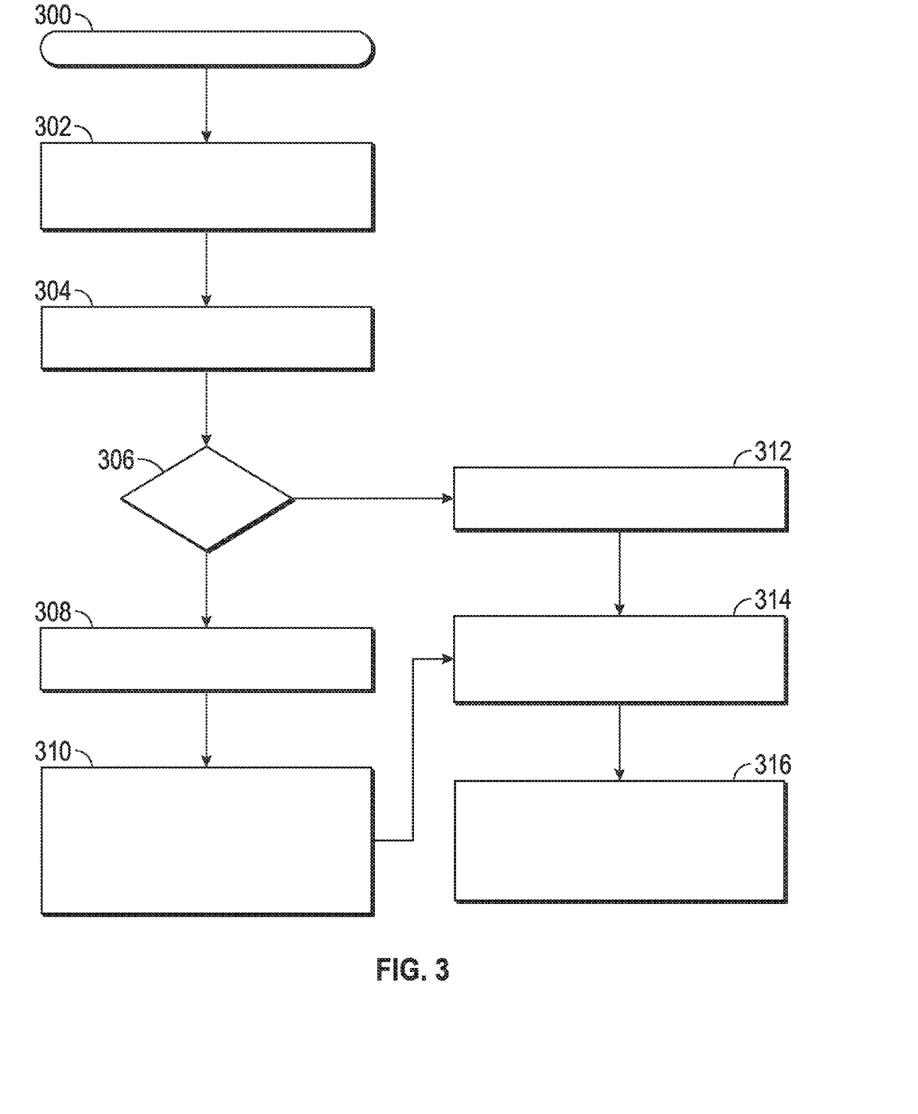
FIG. 3 is a flow chart that illustrates an exemplary embodiment of an onboard sensor calibration process.

FIG. 3 is a flow chart that illustrates an exemplary embodiment of an onboard sensor calibration process 300. The various tasks performed in connection with the process 300 may be performed by software, hardware, firmware, or any combination thereof. For illustrative purposes, the following description of the process 300 may refer to elements mentioned above in connection with FIG. 1 and FIG. 2. It should be appreciated that the process 300 may include any number of additional or alternative tasks, the tasks shown in FIG. 3 need not be performed in the illustrated order, and the process 300 may be incorporated into a more comprehensive procedure or process having additional functionality not described in detail herein. Moreover, one or more of the tasks shown in FIG. 3 could be omitted from an embodiment of the process 300 as long as the intended overall functionality remains intact.

The process 300 can be performed for any type of onboard sensor, and for any number of onboard sensors. Accordingly, the process 300 can be modified as needed to accommodate the particular type of sensor under consideration. Furthermore, the sensor calibration system 100 can execute multiple instantiations of the process 300 concurrently to handle different onboard sensor types during the operation of the host vehicle.

An iteration of the process 300 may begin by acquiring data that is indicative of current real-time conditions (task 302). Task 302 may be associated with receiving accessing, obtaining, generating, or otherwise acquiring the data that is needed to support the process 300. In certain embodiments, task 302 causes the control system 104 to collect the vehicle status data 110 during operation of the vehicle (see FIG. 1). In addition, the control system 104 obtains the navigation map data 114 and acquires the GPS data 112 during operation of the vehicle. It should be appreciated that the process 300 may store historical data in an ongoing manner such that data collected over a period of time can be analyzed and considered.

The process 300 continues by analyzing some or all of the acquired data (task 304) to determine whether calibration initiation conditions are satisfied. The example described here assumes that task 304 analyzes vehicle status data 110, navigation map data 114, and GPS data 112, and that task 304 considers the particular type of onboard sensor being calibrated. In this regard, the specific implementation of the process 300 can vary to accommodate offset calibration of different onboard sensors. Variations on the processing and analysis performed at task 304 are described in detail below in the context of several onboard sensor types.

If the process 300 determines that the calibration initiation conditions are satisfied, i.e., the operating conditions indicate that the calibration of the onboard sensor can be updated (the "Yes" branch of query task 306), then the process 300 continues by calculating a current calibration factor for the onboard sensor (task 308). Thus, calculation of the current calibration factor is based on at least some of the data acquired at task 302 in that the acquired data serves as a trigger mechanism that initiates the calibration procedure. Accordingly, the calculation at task 308 is triggered in response to the satisfaction of the calibration initiation conditions set forth by the particular embodiment of the process 300. In certain embodiments, calibration is initiated only when the combination of the vehicle status data 110, the GPS data 112, and the navigation map data 114 satisfies the particular requirements for the given type of onboard sensor.

Calculation of the current calibration factor can be performed in accordance with conventional techniques, algorithms, and/or methodologies that need not be described in detail here. For the embodiments described here, the current calibration factor represents a zero offset that can be used to adjust raw sensor measurements for improved accuracy. For such embodiments, therefore, the calibration factor represents a sensor offset factor for the onboard sensor of interest. A calibration factor can be expressed in units that are appropriate for the given sensor type, e.g., voltage, current, impedance, or degrees (angular). Moreover, the calibration factor can be a scaled value, an unscaled value, or the like. These and other variations are contemplated by this disclosure.

The process 300 uses the current calibration factor to obtain an updated calibration value for the onboard sensor. For the example presented here, the updated calibration value represents an updated sensor offset value, which can be applied to raw sensor output measurements to improve accuracy. In certain embodiments, the current calibration factor replaces the previously computed calibration value, such that the calibration value is simply updated in an ongoing manner. For the example presented here, however, the current calibration factor is used to compute the updated calibration value (task 310). More specifically, task 310 computes the updated calibration value based on the current calibration factor and at least one previously calculated calibration value (e.g., one or more historical calibration values calculated during prior iterations of the process 300). In accordance with some embodiments, task 310 performs averaging, filtering, and/or smoothing techniques to compute the updated calibration factor from a plurality of calibration factors, including the current calibration factor. Task 310 is desirable to ensure that outlier calibration factors do not adversely affect the calibration routine.

Referring back to query task 306, if the process 300 determines that the sensor calibration should not be updated (the "No" branch of query task 306), then a previously calculated calibration value is retained (task 312). In this regard, the most recently calculated calibration value can be retained for use until it needs to be updated. The process 300 continues by generating a calibrated sensor value (task 314) from the measured sensor data (i.e., the raw sensor output) and either the updated calibration value computed at task 310 or the retained calibration value. The manner in which task 314 generates the calibrated sensor value will depend on the type of onboard sensor being calibrated. For example, task 314 may simply add or subtract a scalar offset value from a raw sensor output value to obtain the calibrated sensor value. As another example, task 314 may use the calibration value as a multiplier to scale the raw sensor output value. As yet another example, task 314 may use the calibration value as a variable in a formula or an expression that also includes the raw sensor output value.

Using the approach described above, the process 300 calibrates the onboard sensor in accordance with the updated calibration value, which is obtained in response to the current calibration factor, which is obtained using the navigation map data 114 and the other data acquired at task 302. The process 300 continues by providing the calibrated sensor value to at least one onboard subsystem, function, process, or feature for handling in an appropriate manner (task 316). For example, a calibrated wheel speed value can be provided to a speedometer function for purposes of displaying the current vehicle speed. As another example, a calibrated acceleration value can be provided to a traction control function for purposes of stabilizing the vehicle. These and other examples are contemplated by this disclosure.

The process 300 can be repeated as often as desired to keep the sensor calibrations up to date. In this regard, some onboard sensors may require calibration once per ignition cycle, while other onboard sensors may require calibration only once per week, once per month, periodically during operation of the vehicle, or the like. The process 300 may be performed as frequently as needed if a sensor is due for calibration. For example, if a wheel speed sensor needs calibration, then the process 300 can be repeated once every 100 milliseconds or once per second until the query task 306 follows the "Yes" branch to initiate calibration. The frequency with which the process 300 is repeated may vary depending on the type of onboard sensor, the configuration of the vehicle, and/or other practical considerations.

Referring back to task 304, the acquired data (e.g., vehicle status data 110, GPS data 112, and navigation map data 114) is analyzed to determine whether or not the current operating conditions are satisfactory for purposes of calibrating the onboard sensor. The decision criteria and the data that is considered at task 304 are chosen such that they are appropriate for the type of onboard sensor being calibrated. Although the subject matter presented here can be applied in the context of a wide variety of onboard sensor types, the following examples are described in detail below: wheel speed sensor; longitudinal acceleration sensor; lateral acceleration sensor; yaw rate sensor; and steering angle sensor. It should be appreciated that these examples are not exhaustive, and are not intended to restrict or otherwise limit the scope or applicability of the disclosed subject matter in any way.

If the onboard sensor of interest is a wheel speed sensor, then the process 300 considers the acquired data as follows to determine whether to initiate the calibration routine for the wheel speed sensor. For this particular embodiment, at least some of the vehicle status data 110 is analyzed to determine whether the vehicle is driving straight (within a specified practical range). For this particular application, "straight" may refer to zero yaw rate and/or zero steering angle. In practice, the system may consider 1.0 degree/second yaw rate and 2.0 degrees of hand wheel angle to be a relatively tight tolerance for purposes of determining whether the vehicle is driving straight. To this end, the analyzed vehicle status data 110 may include information obtained from the inertial measurement unit, the steering angle sensor, and/or at least some of the four wheel speed sensors. If the vehicle status data 110 does not indicate that the vehicle is travelling straight (or substantially straight within the defined tolerance of the system), then calibration is not initiated at this time (the "No" branch of query task 306 is followed).

For a wheel speed sensor, the process 300 also checks the GPS data 112 to determine whether the vehicle speed as indicated by the GPS data 112 is accurate. In this regard, the process 300 may compare the vehicle speed derived from the GPS data 112 to the vehicle speed indicated by the speedometer. In certain embodiments, the GPS data 112 may include or otherwise indicate the accuracy of the GPS system. For example, the GPS data 112 may include some form of error bounds (data and an associated error band) or an indicator of the relative accuracy (accurate, very accurate, suspect, invalid). If the vehicle speed indicated by the GPS data 112 is within a specified tolerance of the speedometer value (e.g., within 10%), then the GPS-derived speed is considered to be accurate. If the GPS-derived speed is not accurate, then calibration is not initiated at this time (the "No" branch of query task 306 is followed).

For a wheel speed sensor, the process 300 also checks the navigation map data 114 to determine whether the vehicle is travelling on a straight road (or a substantially straight road as tolerated by the system design). This check is desirable to increase the likelihood that all four of the wheels are rotating at the same speed when the wheel speed sensors are calibrated. If the navigation map data 114 indicates that the road is curved or that curves are approaching soon, then calibration is not initiated at this time (the "No" branch of query task 306 is followed). The navigation map data 114 can also be checked to ensure that GPS data 112 will be available during the potential calibration time period. In this regard, the navigation map data 114 is analyzed to determine whether there are any overhead obstructions, structures, or other features on or near the road that could block or otherwise affect the accuracy of the received GPS data 112. This aspect is important because the navigation map data 114 is linked to the current geographical position of the vehicle, which is derived from the real-time GPS data 112. Thus, the process 300 checks the navigation map data 114 to increase the likelihood that valid and accurate GPS data 112 can be received throughout the calibration period. Accordingly, if the navigation map data 114 indicates the presence of potentially obstructing structures or features, then calibration is not initiated at this time (the "No" branch of query task 306 is followed).

Consequently, the process 300 initiates calibration of a wheel speed sensor only if: (1) the vehicle status data 110 indicates that the vehicle is currently driving in a straight or substantially straight line; (2) the GPS data 112 is deemed accurate; (3) the navigation map data 114 indicates that the vehicle is travelling on a straight or substantially straight road; and (4) the navigation map data 114 indicates that the sky is clear of overhead obstructions for at least a minimum distance ahead of the vehicle. If this criteria is satisfied, then the "Yes" branch of query task 306 is followed to initiate the calibration routine for the wheel speed sensor. In practice, a calibration value is independently calculated for each of the four wheel speed sensors of the vehicle. For a wheel speed sensor, the calibration value is realized as a multiplier that is applied to the raw wheel speed sensor output. For example, the calibration value can be calculated as a ratio of the measured speed (as determined by the raw wheel speed sensor output) divided by the GPS-derived vehicle speed.

If the onboard sensor of interest is a longitudinal acceleration sensor, then the process 300 considers the acquired data as follows to determine whether to initiate the calibration routine for the longitudinal acceleration sensor. In practice, a longitudinal acceleration sensor should be calibrated at a time when gravitational forces will not impact the calibration routine. Accordingly, for this particular embodiment, at least some of the vehicle status data 110 is analyzed to determine whether the vehicle is driving straight (within a specified practical range), as described above for the wheel speed sensor. If the vehicle status data 110 does not indicate that the vehicle is travelling straight (or substantially straight within the defined tolerance of the system), then calibration is not initiated at this time (the "No" branch of query task 306 is followed).

For a longitudinal acceleration sensor, the process 300 also checks the vehicle status data 110 to determine whether the vehicle speed has been constant for at least a minimum period of time, such as two seconds, one second, etc. In other words, the vehicle status data 110 is checked to determine whether the vehicle is currently accelerating or decelerating. The process 300 may consider "constant" speed to be a speed that does not fluctuate by more than a maximum amount during the designated time period. In accordance with one non-limiting example, if the vehicle speed changes by less than two miles per hour during the monitored time period, then the process 300 considers the speed to be constant for purposes of longitudinal acceleration sensor calibration.

For a longitudinal acceleration sensor, the process 300 also checks the navigation map data 114 to determine whether the vehicle is travelling on a road having little to no grade (as dictated by the tolerance of the system). In this context, zero grade means that the road is neither uphill nor downhill. Theoretically, zero grade means that the road surface is parallel to sea level in the vehicle longitudinal direction. Grade is usually expressed as "percentage grade" and, therefore, a one or two percent grade may be considered to be within tolerance for the determination of flat or "zero" grade. If the navigation map data 114 indicates that the vehicle is currently travelling (or will soon be travelling) on a graded road, then calibration is not initiated at this time (the "No" branch of query task 306 is followed). The navigation map data 114 can also be checked to ensure that GPS data 112 will be available during the potential calibration time period, as explained above with reference to wheel speed sensor calibration. Accordingly, if the navigation map data 114 indicates the presence of potentially obstructing structures or features, then calibration is not initiated at this time (the "No" branch of query task 306 is followed).

Accordingly, the process 300 initiates calibration of a longitudinal acceleration sensor only if: (1) the vehicle status data 110 indicates that the vehicle is currently driving in a straight or substantially straight line; (2) the vehicle status data 110 indicates that the vehicle speed is or has been relatively constant; (3) the navigation map data 114 indicates that the vehicle is travelling on a road having zero or substantially zero grade; and (4) the navigation map data 114 indicates that the sky is clear of overhead obstructions for at least a minimum distance ahead of the vehicle. If this criteria is satisfied, then the "Yes" branch of query task 306 is followed to initiate the calibration routine for the longitudinal acceleration sensor. For a longitudinal acceleration sensor, the calibration value is realized as a scalar offset value that is used to adjust (e.g., added to or subtracted from) the raw longitudinal acceleration sensor output.

If the onboard sensor of interest is a lateral acceleration sensor, then the process 300 considers the acquired data in the following manner to determine whether to initiate the calibration routine for the lateral acceleration sensor. In practice, a lateral acceleration sensor should be calibrated at a time when gravitational and/or dynamic lateral forces will not impact the calibration routine. Accordingly, for this particular embodiment, at least some of the vehicle status data 110 is analyzed to determine whether the vehicle is driving straight (within a specified practical range), as described above for the wheel speed sensor. If the vehicle status data 110 does not indicate that the vehicle is travelling straight (or substantially straight within the defined tolerance of the system), then calibration is not initiated at this time (the "No" branch of query task 306 is followed).

For a lateral acceleration sensor, the process 300 also checks the navigation map data 114 to determine whether the vehicle is travelling on a straight road (or a substantially straight road as tolerated by the system design). If the navigation map data 114 indicates that the road is curved or that curves are approaching soon, then calibration is not initiated at this time (the "No" branch of query task 306 is followed). The navigation map data 114 is also checked to determine whether the vehicle is travelling on a banked road. Theoretically, a road with zero banking means that the road surface is parallel to sea level in the vehicle lateral direction. The bank of a road is usually expressed as a banking angle and, therefore, a one or two degree banking angle may be considered to be within tolerance for purposes of the process 300. If the navigation map data 114 indicates that the vehicle is travelling on, or will soon be travelling on, a road having more than a negligible amount of banking angle, then calibration is not initiated (the "No" branch of query task 306 is followed).

The navigation map data 114 can also be checked to ensure that GPS data 112 will be available during the potential calibration time period, as explained above with reference to wheel speed sensor calibration. Accordingly, if the navigation map data 114 indicates the presence of potentially obstructing structures or features, then calibration is not initiated at this time (the "No" branch of query task 306 is followed).

Accordingly, the process 300 initiates calibration of a lateral acceleration sensor only if: (1) the vehicle status data 110 indicates that the vehicle is currently driving in a straight or substantially straight line; (2) the navigation map data 114 indicates that the vehicle is travelling on a straight or substantially straight road; (3) the navigation map data 114 indicates that the vehicle is travelling on a road having zero or substantially zero banking angle; and (4) the navigation map data 114 indicates that the sky is clear of overhead obstructions for at least a minimum distance ahead of the vehicle. If this criteria is satisfied, then the "Yes" branch of query task 306 is followed to initiate the calibration routine for the lateral acceleration sensor. For a lateral acceleration sensor, the calibration value is realized as a scalar offset value that is used to adjust (e.g., added to or subtracted from) the raw lateral acceleration sensor output.

If the onboard sensor of interest is a yaw rate sensor, then the process 300 considers the acquired data in the following manner to determine whether to initiate the calibration routine for the yaw rate sensor. In practice, a yaw rate sensor should be calibrated at a time when gravity and dynamic forces forces will not impact the calibration routine (i.e., the road has little to no grade, little to no bank, and the vehicle speed is relatively steady state). Accordingly, for this particular embodiment, at least some of the vehicle status data 110 is analyzed to determine whether the vehicle is driving straight (within a specified practical range), as described above for the wheel speed sensor. If the vehicle status data 110 does not indicate that the vehicle is travelling straight (or substantially straight within the defined tolerance of the system), then calibration is not initiated at this time (the "No" branch of query task 306 is followed).

For a yaw rate sensor, the process 300 also checks the navigation map data 114 to determine whether the vehicle is travelling on a straight road (or a substantially straight road as tolerated by the system design). If the navigation map data 114 indicates that the road is curved or that curves are approaching soon, then calibration is not initiated at this time (the "No" branch of query task 306 is followed). The navigation map data 114 is also analyzed to determine whether the vehicle is travelling on a flat road, i.e., a road having zero or substantially zero grade, and having zero or substantially zero banking angle (as described previously). If the navigation map data 114 indicates that the road is not flat, or that the immediately approaching road segment is not flat, then calibration is not initiated at this time (the "No" branch of query task 306 is followed).

The navigation map data 114 can also be checked to ensure that GPS data 112 will be available during the potential calibration time period, as explained above with reference to wheel speed sensor calibration. Accordingly, if the navigation map data 114 indicates the presence of potentially obstructing structures or features, then calibration is not initiated at this time (the "No" branch of query task 306 is followed).

Accordingly, the process 300 initiates calibration of a yaw rate sensor only if: (1) the vehicle status data 110 indicates that the vehicle is currently driving in a straight or substantially straight line; (2) the navigation map data 114 indicates that the vehicle is travelling on a straight or substantially straight road; (3) the navigation map data 114 indicates that the vehicle is travelling on a road that is flat or substantially flat; and (4) the navigation map data 114 indicates that the sky is clear of overhead obstructions for at least a minimum distance ahead of the vehicle. If this criteria is satisfied, then the "Yes" branch of query task 306 is followed to initiate the calibration routine for the yaw rate sensor. For a yaw rate sensor, the calibration value is realized as a scalar offset value that is used to adjust (e.g., added to or subtracted from) the raw yaw rate sensor output.

If the onboard sensor of interest is a steering angle sensor, then the process 300 considers the acquired data in the following manner to determine whether to initiate the calibration routine for the steering angle sensor. In practice, a steering angle sensor should be calibrated at a time when the steering wheel is being held at its zero angle position and when dynamic forces forces will not impact the calibration routine. Accordingly, for this particular embodiment, at least some of the vehicle status data 110 is analyzed to determine whether the vehicle is driving straight (within a specified practical range), as described above for the wheel speed sensor. If the vehicle status data 110 does not indicate that the vehicle is travelling straight (or substantially straight within the defined tolerance of the system), then calibration is not initiated at this time (the "No" branch of query task 306 is followed).

For a steering angle sensor, the process 300 also checks the navigation map data 114 to determine whether the vehicle is travelling on a straight road (or a substantially straight road as tolerated by the system design). If the navigation map data 114 indicates that the road is curved or that curves are approaching soon, then calibration is not initiated at this time (the "No" branch of query task 306 is followed). The navigation map data 114 is also analyzed to determine whether the vehicle is travelling on a flat road, i.e., a road having zero or substantially zero grade, and having zero or substantially zero banking angle (as described previously). If the navigation map data 114 indicates that the road is not flat, or that the immediately approaching road segment is not flat, then calibration is not initiated at this time (the "No" branch of query task 306 is followed).

The navigation map data 114 can also be checked to ensure that GPS data 112 will be available during the potential calibration time period, as explained above with reference to wheel speed sensor calibration. Accordingly, if the navigation map data 114 indicates the presence of potentially obstructing structures or features, then calibration is not initiated at this time (the "No" branch of query task 306 is followed).

Accordingly, the process 300 initiates calibration of a steering angle sensor only if: (1) the vehicle status data 110 indicates that the vehicle is currently driving in a straight or substantially straight line; (2) the navigation map data 114 indicates that the vehicle is travelling on a straight or substantially straight road; (3) the navigation map data 114 indicates that the vehicle is travelling on a road that is flat or substantially flat; and (4) the navigation map data 114 indicates that the sky is clear of overhead obstructions for at least a minimum distance ahead of the vehicle. If this criteria is satisfied, then the "Yes" branch of query task 306 is followed to initiate the calibration routine for the steering angle sensor. For a steering angle sensor, the calibration value is realized as an offset angle value that is used to adjust (e.g., added to or subtracted from) the raw steering angle sensor output.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of calibrating an onboard sensor of a vehicle having a control system, the method comprising:
   collecting, with the control system, vehicle status data generated by onboard instruments, measurement devices, sensors, and/or transducers during operation of the vehicle;
   obtaining navigation map data with the control system during operation of the vehicle, the navigation map data comprising road data that characterizes road geometry, including road curvature, road grade, road contour, and/or road banking angle;
   analyzing the collected vehicle status data and the obtained navigation map data to determine that calibration initiation conditions are satisfied for purposes of performing a zero value offset calibration of the onboard sensor to reduce sensor error associated with baseline or zero condition readings of the onboard sensor;
   checking the road data of the navigation map data to determine whether current road conditions are suitable for purposes of initiating zero value offset calibration of the onboard sensor;
   calculating, with the control system, a current zero offset value for the onboard sensor based on the collected vehicle status data and the obtained navigation map data, wherein the calculating is triggered only in response to satisfaction of the calibration initiation conditions, and only when the checking step determines that the current road conditions are suitable for purposes of initiating zero value offset calibration of the onboard sensor; and
   calibrating, with the control system, the onboard sensor using the current zero offset value, wherein the calculated current zero offset value is applied to adjust nonzero raw sensor values associated with baseline or zero condition readings of the onboard sensor.

2. The method of claim 1, wherein the control system collects the vehicle status data in real-time during operation of the vehicle.

3. The method of claim 1, wherein:
   the onboard sensor comprises a wheel speed sensor; and
   the calculating is triggered only if the obtained navigation map data indicates that the vehicle is travelling on a substantially straight road.

4. The method of claim 1, wherein:
   the onboard sensor comprises a longitudinal acceleration sensor; and
   the calculating is triggered only if the obtained navigation map data indicates that the vehicle is travelling on a road having substantially zero grade.

5. The method of claim 1, wherein:
the onboard sensor comprises a lateral acceleration sensor; and
the calculating is triggered only if the obtained navigation map data indicates that the vehicle is travelling on a road having substantially zero banking angle.

6. The method of claim 1, wherein:
the onboard sensor comprises a yaw rate sensor; and
the calculating is triggered only if the obtained navigation map data indicates that the vehicle is travelling on a substantially straight and flat road.

7. The method of claim 1, wherein:
the onboard sensor comprises a steering angle sensor; and
the calculating is triggered only if the obtained navigation map data indicates that the vehicle is travelling on a substantially straight and flat road.

8. The method of claim 1, further comprising:
computing an updated calibration value for the onboard sensor based on the current zero offset value and at least one previously calculated calibration value, wherein the control system calibrates the onboard sensor in response to the updated calibration value.

9. The method of claim 1, wherein:
the calibrating generates a calibrated sensor value; and
the method further comprises providing the calibrated sensor value to an onboard subsystem of the vehicle.

10. The method of claim 1, further comprising:
acquiring geographic position data for the vehicle, wherein the control system calculates the current zero offset value based on the collected vehicle status data, the obtained navigation map data, and the acquired geographic position data.

11. A computer readable storage media comprising executable instructions capable of performing a method of calibrating on onboard sensor of a vehicle, the method comprising:
collecting, with a control system of the vehicle, vehicle status data generated by onboard instruments, measurement device, sensors, and/or transducers during operation of the vehicle;
obtaining navigation map data with the control system during operation of the vehicle; the navigation map data comprising road data that characterizes road geometry, including road curvature, road grade, road contour, and/or road banking angle;
analyzing the collected vehicle status data and the obtained navigation map data to determine whether calibration initiation conditions are satisfied for purposes of performing a zero value offset calibration of the onboard sensor to reduce sensor error associated with baseline or zero condition readings of the onboard sensor;
checking the road data of the navigation map data to determine whether current road conditions are suitable for purposes of initiating zero value offset calibration of the onboard sensor;
calculating, with the control system, a current zero offset value for the onboard sensor based on the collected vehicle status data and the obtained navigation map data, wherein the calculating is performed only when the calibration initiation conditions are satisfied, and only when the checking determines that the current road conditions are suitable for purposes of initiating zero value offset calibration of the onboard sensor; and
calibrating the onboard sensor using the current zero offset value, wherein the calculated current zero offset value is applied to adjust nonzero raw sensor values associated with baseline or zero condition readings of the onboard sensor.

12. The computer readable storage media of claim 11, wherein the method performed by the executable instructions further comprises:
computing an updated calibration value for the onboard sensor based on the current zero offset value and at least one previously calculated calibration factor; wherein calibrating the onboard sensor is performed using the updated calibration value.

13. The computer readable storage media of claim 12, wherein:
the calibrating generates a calibrated sensor value; and
the method performed by the executable instructions provides the calibrated sensor value to an onboard subsystem of the vehicle.

14. The computer readable storage media of claim 11, wherein the method performed by the executable instructions further comprises:
acquiring geographic position data for the vehicle, wherein the current zero offset value is calculated based on the collected vehicle status data, the obtained navigation map data, and the acquired geographic position data.

15. A vehicle comprising:
an onboard sensor configured to generate raw sensor values; and
a control system comprising at least one processor device to collect vehicle status data generated by onboard instruments, measurement devices, sensors, and/or transducers during operation of the vehicle, obtain navigation map data during operation of the vehicle, the navigation map data comprising road data that characterizes road geometry, including road curvature, road grade, road contour, and/or road banking angle, analyze the collected vehicle status data and the obtained navigation map data to determine whether calibration initiation conditions are satisfied for purposes of performing a zero value offset calibration of the onboard sensor to reduce sensor error associated with baseline or zero condition readings of the onboard sensor, check the road data of the navigation map data to determine whether current road conditions are suitable for purposes of initiating zero value offset calibration of the onboard sensor, calculate a current zero offset value for the onboard sensor based on the collected vehicle status data, wherein the current zero offset value is calculated only when the calibration initiation conditions are satisfied, and only when the checking step determines that the current road conditions are suitable for purposes of initiating zero value offset calibration of the onboard sensor, and calibrate the onboard sensor with the current zero offset value, wherein the calculated current zero offset value is applied to adjust nonzero raw sensor values associated with baseline or zero condition readings of the onboard sensor.

16. The vehicle of claim 15, wherein the control system comprises at least one electronic control unit.

17. The vehicle of claim 15, wherein the control system computes an updated sensor offset value for the onboard sensor based on the current zero offset value and at least one previously calculated sensor offset value, and calibrates the onboard sensor with the updated sensor offset value.

18. The vehicle of claim 17, wherein:
the calibrating generates a calibrated sensor value; and
the control system provides the calibrated sensor value to an onboard subsystem of the vehicle.

19. The vehicle of claim 15, wherein the control system acquires geographic position data for the vehicle, and determines that the calibration initiation conditions are satisfied based on the current vehicle status data, the current navigation map data, and current geographic position data.

* * * * *